(12) United States Patent  
Towle

(10) Patent No.: US 6,518,171 B1  
(45) Date of Patent: Feb. 11, 2003

(54) DUAL DAMASCENE PROCESS USING A LOW K INTERLAYER FOR FORMING VIAS AND TRENCHES

(75) Inventor: Steven N. Towle, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/967,125

(22) Filed: Sep. 27, 2001

(51) Int. Cl.$^7$ .............................................. H01L 21/469

(52) U.S. Cl. .................. 438/624; 438/626; 438/627; 438/638; 438/687; 438/786

(58) Field of Search ................................. 438/624, 626, 438/627, 631, 638, 639, 643, 645, 653, 687, 761, 783, 784, 786

(56) References Cited

U.S. PATENT DOCUMENTS

| | | | | |
|---|---|---|---|---|
| 5,705,430 A | * | 1/1998 | Avanzino et al. | 437/195 |
| 5,753,967 A | * | 5/1998 | Lin | 257/635 |
| 6,114,259 A | * | 9/2000 | Sukharev et al. | 438/789 |
| 6,245,690 B1 | * | 6/2001 | Yau et al. | 438/780 |
| 6,251,770 B1 | * | 6/2001 | Uglow et al. | 438/624 |
| 6,277,728 B1 | * | 8/2001 | Ahn et al. | 438/619 |
| 6,287,961 B1 | * | 9/2001 | Liu et al. | 438/638 |

* cited by examiner

Primary Examiner—Chandra Chaudhari  
Assistant Examiner—Stephen W. Smoot  
(74) Attorney, Agent, or Firm—Blakely, Sokoloff, Taylor & Zafman LLP

(57) ABSTRACT

Dual-Damascene processes for difficult to etch low k dielectric such as carbon-doped oxide. First deposition of dielectric is made to thickness of vias only, then etched. Second depositions of dielectric is made to thickness of conductor and then etched.

21 Claims, 4 Drawing Sheets

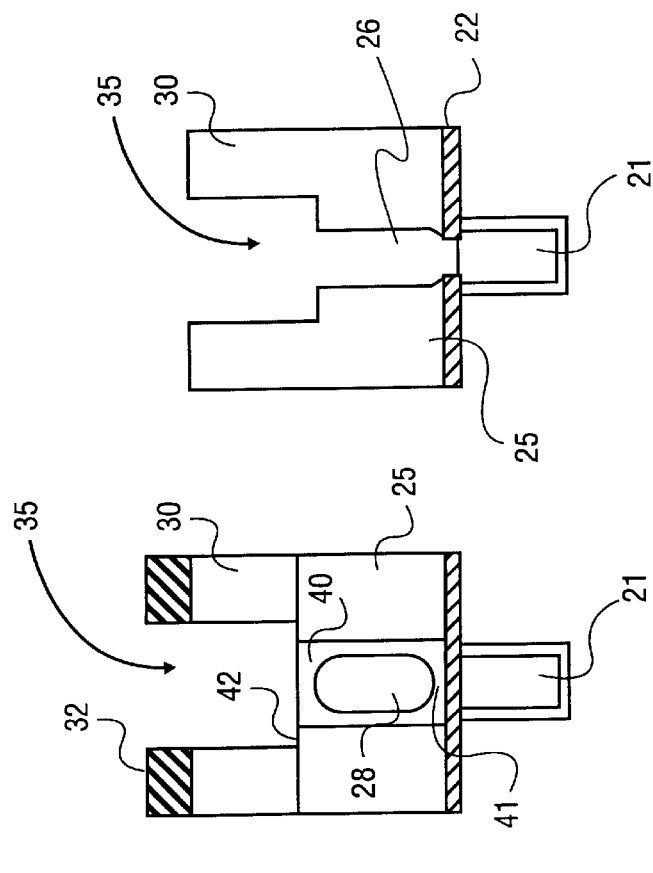
FIG. 6
FIG. 5
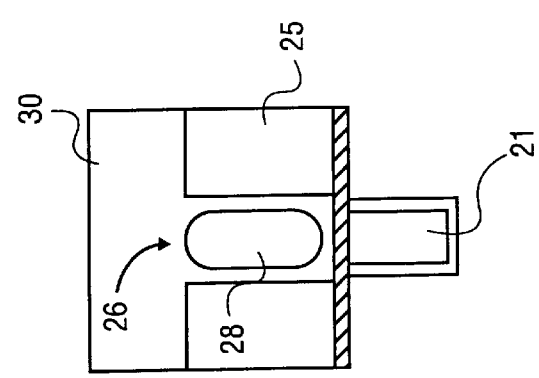
FIG. 4
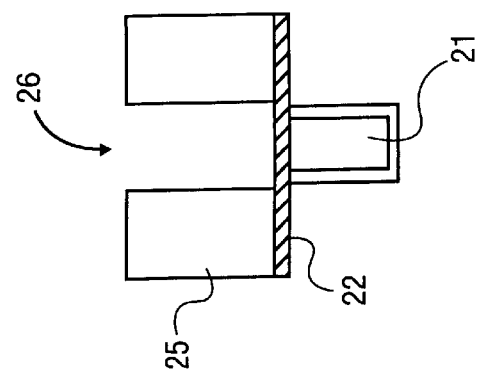
FIG. 3

US 6,518,171 B1

DUAL DAMASCENE PROCESS USING A LOW K INTERLAYER FOR FORMING VIAS AND TRENCHES

BACKGROUND

1. Field of Invention

The invention relates to the field of forming interconnect layers in semiconductor integrated circuits, particularly in connection with damascene process.

2. Prior Art

Low k dielectrics are favored in the formation of interconnect layers in integrated circuits because they reduce the parasitic capacitance between the conductors in these layers. In some cases, the low k dielectric materials are difficult to etch, for instance, they etch slowly and costly equipment is required for their etching. This is the case for a carbon-doped oxide.

FIGS. 1A–1D show typical prior art processing which requires etching twice through the trench region of an interlayer dielectric (ILD). As shown in FIG. 1A, a first opening 10 is formed to define the vias. Now, another low k dielectric etching step is needed as shown in FIG. 1B, to define the trench 11 over the underlying via opening. Then as shown in FIG. 1C, the dielectric etchant stop used between the interconnect layers is removed to expose the underlying conductor. FIG. 1D illustrates the formation of a conductive barrier material to line the via and trench opening. As can be seen, the trench region of the ILD is etched through twice, once as shown in FIG. 1A and again, as shown in FIG. 1C. This is both time consuming and costly for some otherwise desirable low k dielectrics.

BRIEF DESCRIPTION OF THE DRAWINGS

FIG. 1A is a cross-sectional elevation view of an integrated circuit showing the formation of an opening through an interlayer dielectric (ILD);

FIG. 1B illustrates the structure of FIG. 1A after a trench has been etched in the ILD;

FIG. 1C illustrates the structure of FIG. 1B after an additional layer has been removed; and FIG. 1D illustrates the structure of FIG. 1C after the formation of a barrier layer.

FIG. 3 is similar to FIG. 2D and used for the discussion of FIGS. 4–6.

FIG. 4 is a more detailed drawing of FIG. 2E.

FIG. 5 illustrates the structure of FIG. 4 after additional processing.

FIG. 6 illustrates the structure of FIG. 5 after additional processing and is a more detailed drawing of the structure of FIG. 2F.

DETAILED DESCRIPTION

An improvement in the dual damascene process, particularly suited for low k dielectrics such as carbon-doped oxide, is disclosed. In the following description, numerous specific details are set forth in order to provide a thorough understanding of the present invention. It will be apparent to one skilled in the art that the present invention may be practiced without these specific details. In other instances, well-known processing steps have not been described in detail in order not to unnecessarily obscure the present invention.

Referring first to FIG. 2, the upper portion of an interconnect layer 20 is illustrated which includes a conductor 21 (vias in this interconnect layer are not shown). For purposes of describing the present invention, an interconnect layer is formed on ILD 20 with an embodiment of the present invention. The ILD layer 20 is sometimes referred to as the underlying layer in the following discussions. The ILD 20 and the conductor 21 may be formed in any one of numerous well-known processes such as a dual damascene process, or, this layer may be formed as taught herein.

A dielectric layer 22 used as an etchant stop is formed on layer 20. A silicon nitride ($Si_3N_4$) or silicon carbide (SiC) layer may be used for this purpose.

Now, a first dielectric layer 25 is formed on the dielectric layer 22. This layer is formed to a thickness which corresponds to both the depth of the vias and the thickness of dielectric above layer 22 disposed between the conductor 21 and the conductors subsequently formed on layer 25. The layer 25 is preferably fabricated from a low k dielectric (e.g., k<3) such as a carbon-doped oxide. Note that the thickness of the layer 25 does not include the depth of the conductors. For reasons discussed below, layer 25 is made slightly thicker (e.g. 10–20% thicker) than its ultimate desired thickness for one embodiment.

Figure 1D:
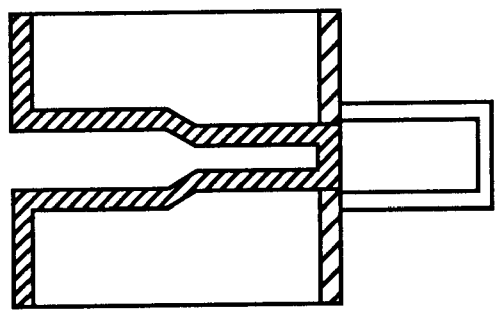
FIGS. 1A–1D show prior art processing specifically.
Figure 1C:
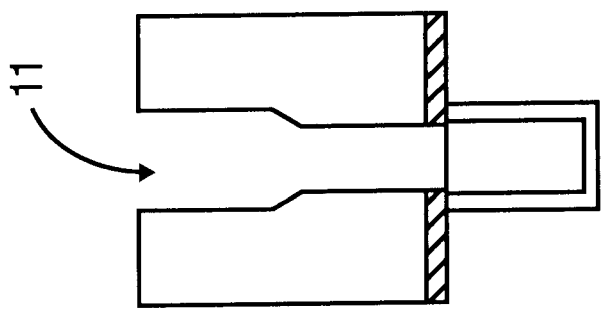
Figure 1B:
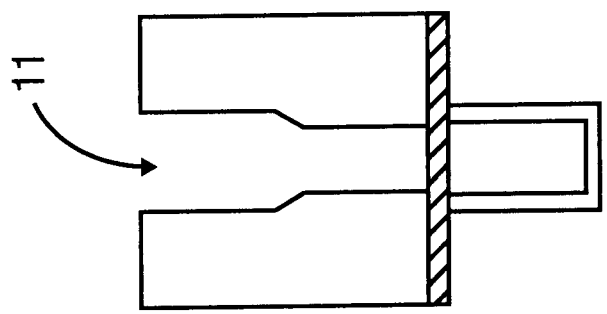
Figure 1A:
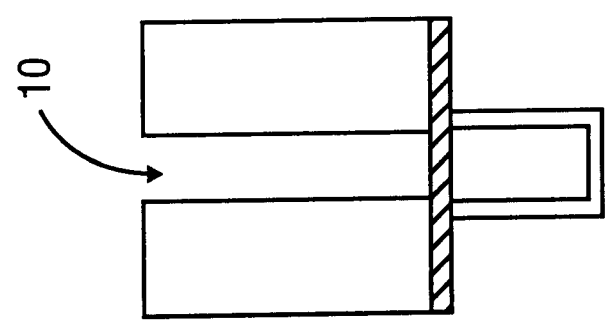
Figure 2A:
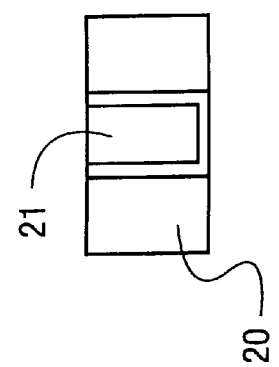
FIG. 2A is cross-sectional elevation view of a conductor in an underlying ILD.
Figure 2B:
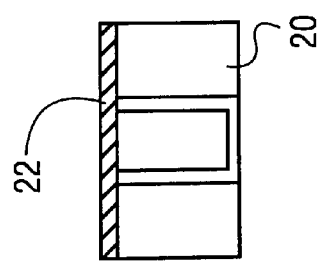
FIG. 2B illustrates the structure of FIG. 2A after a dielectric layer (etchant stop) has been formed on the upper surface of the underlying ILD.
Figure 2C:
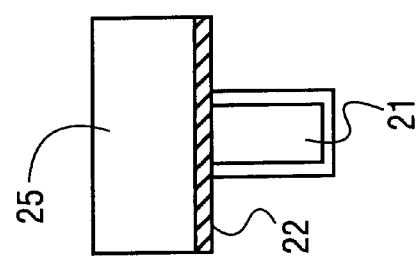
FIG. 2C illustrates the structure of FIG. 2B after a first ILD has been formed on the etchant stop layer.
Figure 2D:
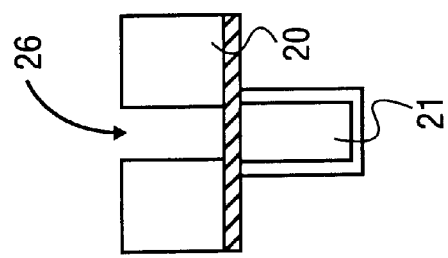
FIG. 2D illustrates the structure of FIG. 2C after an opening has been etched in the first ILD layer.

Now, an opening 26 is formed in the layer 25 as can be seen both in FIGS. 2D and in FIG. 3. This opening is a via which is used to form a contact to the conductor 21. In one embodiment, the width of the opening 26 is made slightly larger (over etched) than is needed for the contact, for instance, ten percent to twenty percent (10%–20%) wider. The reason for this is that a dielectric deposition in the subsequent step may partially fill opening 26 as will be discussed. An ordinary masking and etching step is used to form the opening 26. Note that when compared to the opening 10 of FIG. 1A, the via opening 26 requires substantially less etching.

Figure 2E:
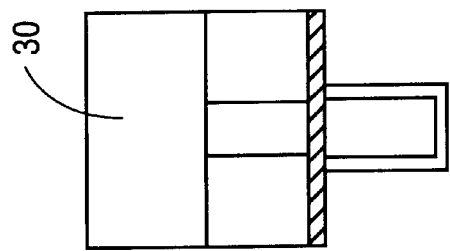
FIG. 2E illustrates the structure of FIG. 2D after a second dielectric layer has been formed on the upper surface of the first ILD layer.

Referring now to FIGS. 2E and FIG. 4, a second dielectric layer, which again preferably is a low k material such as the carbon-doped oxide, is formed on the upper surface of the layer 25. This may be but is not necessarily the same material as layer 25. The thickness of this layer is made to approximately the thickness desired for the conductors that will be formed in the layer 30. Note that when the layer 30 is deposited on the layer 25, the opening 26 is exposed to this deposition. For this reason, the gap filling or step coverage qualities of the layer 30 must be poor so that the opening 26 is not filled with a dielectric. The void 28 shown in FIG. 4 is the region where the material from layer 20 fails to fill. Carbon-doped oxide may be deposited such that this is the case. As shown in FIG. 4, some dielectric is formed along the walls of the opening 26 and at the bottom of the opening 26. This is the reason the opening 26 was initially over etched, since the subsequent contact will have the width of approximately the void 28.

Gap filling and step coverage are terms often used to describe how well a material fills a gap or step. Generally, good or high gap filling or step coverage is sought unlike the property sought for the currently described process. Step coverage can be defined as the thickness of material deposited on the bottom of the via divided by the thickness deposited in a region apart from the via opening, for instance, a region on the top surface of the substrate. If the top lateral growth rate across the via opening is the same as top region spaced-apart from the opening, for 2 to 1 aspect ratio and 10% step coverage, the thickness of material deposited on the via bottom is approximately 5% of the via width. This is a useful step coverage for the currently described process. (In practice, the lateral growth is slightly less than the top surface growth.) In general, the newer techniques use higher aspect ratio vias. This helps in that less material is deposited within the vias.

Referring now to FIG. 5, an ordinary masking step is used to form the members 32 which define the trench 35. This trench over lies the via opening. When the trench 35 is etched, additional etching occurs to remove the deposited material 40 and 41 which resulted in the formation of layer 30. As this occurs, some of the upper surface of the layer 25 shown by number 42 is also removed. It is because of this that the layer 25 is made slightly thicker than the target height of the contact. FIG. 5 illustrates the etching process before the bridged via is open. FIG. 6, on the other hand, illustrates the via opening 26 after the bridged via has been opened and the material 41 of FIG. 5 has been etched away. Because of the anisotropic characteristic of the etching typically used, the material from layer 30 at the top and bottom of the via opening is removed whereas the material on the sidewalls of the opening will not necessarily be removed.

Figure 2I:
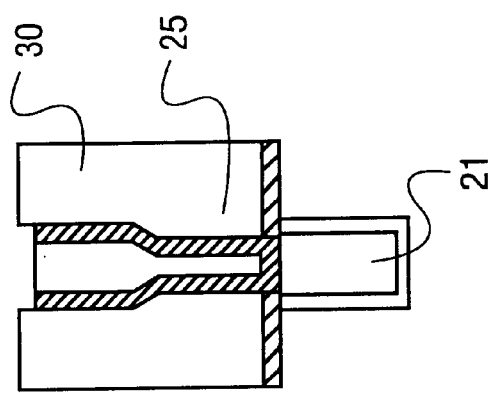
FIG. 2I illustrates the structure of FIG. 2H after a planarization step.
Figure 2H:
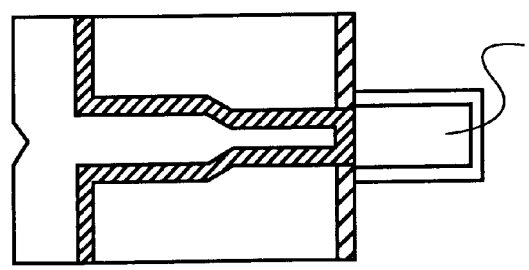
FIG. 2H illustrates the structure of FIG. 2G after copper has been plated onto the barrier layer.
Figure 2G:
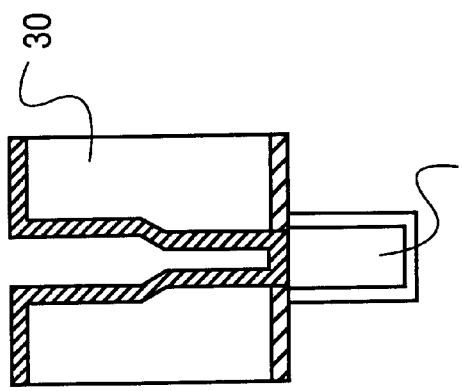
FIG. 2G illustrates the structure of FIG. 2F after a conductive barrier layer has been formed in the trench and via openings.
Figure 2F:
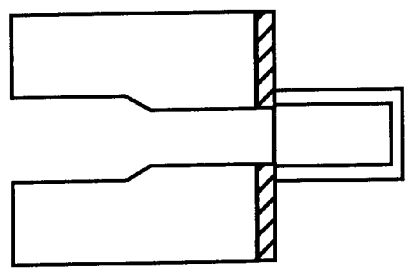
FIG. 2F illustrates the structure of FIG. 2E after a trench has been etched in the second dielectric layer.

Now, as illustrated in FIGS. 2F and FIG. 6, another etching step is used to etch layer 22 in alignment with the opening 26. This exposes the underlying conductor 21 and assures that when a contact is formed within the via opening 26, it contacts the underlying conductor 21.

Next, as shown in FIG. 2G, a conductive barrier material is formed which covers the interior of the trench and via opening as well as the upper surface of the layer 30. A typical barrier material, such as tantalum or tantalum nitride may be used. Following this, as shown in FIG. 2H, the forming of a conductive material such as copper or copper alloy occurs such as by electroplating. Then, as shown in FIG. 2I, a chemical-mechanical polishing (CMP step) is typically used to remove the conductive material from the upper surface of the layer 30 and define the conductors within the dielectric layer 25. Other processes known in the art for filling dual damascene trenches and vias may also be used.

In one embodiment, different material are used for layers 25 and 30. This simplifies the etching where, for example, layer 25 etches more slowly than layer 30 when the trenches are formed.

Thus, as described above, etching of the low k, carbon-doped dielectric does not occur twice through the entire thickens of the ILD as shown in FIGS. 1A–1D. Rather, as shown inn FIGS. 2 and 3–6, the etching occurs in two steps, once through the thickness of layer 25 and again, once through the thickness of layer 30 with some additional etching to break though the bridge and the material at the bottom of the opening 26. This reduces both the cost and time required for a low k dual damascene process.

What is claimed:

1. A method for fabricating an interconnect layer in an integrated circuit comprising:

depositing a first dielectric layer;

forming via openings in the first dielectric layer, the via openings are over-etched to compensate for subsequent deposition of a second dielectric layer;

depositing the second dielectric layer over the first dielectric layer;

forming trenches in the second dielectric layer, which open onto the underlying vias; and filling the vias and trenches with conductive materials.

2. The method defined by claim 1 wherein the step of forming the trenches includes over etching the trench openings to remove dielectric material which may have been deposited on the bottom of the via in the second dielectric deposition step.

3. The method defined by claim 1 wherein the second dielectric layer has poor gap filling qualities, and consequently, does not fill the underlying vias.

4. The method defined by claim 3 wherein the first dielectric layer comprises a low k material.

5. The method defined by claim 4 wherein the second dielectric layer comprises a low k material.

6. The method defined by claim 5 wherein the first and second dielectric layer comprise a carbon-doped oxide.

7. The method defined by claim 6 wherein the conductive materials comprise a conductive barrier layer and a copper layer.

8. The method defined by claim 3 wherein the filling step comprises filling the vias and trenches with a conductive barrier material followed by the forming of copper and the additional step of then polishing an upper surface of the second dielectric layer.

9. The method defined by claim 8 wherein the first and second dielectric layers are a low k material.

10. The method defined by claim 9 wherein the low k material comprises a carbon-doped oxide.

11. The method defined by claim 3 wherein the step of forming the trenches includes over etching the trench openings to remove dielectric material which may have been deposited on the bottom of the via in the second dielectric deposition step.

12. An improved damascene process wherein the dielectric in an interconnect layer is formed in two separate depositions, the first deposition being approximately equal in thickness to via openings formed in a first layer, the via openings being formed in the first layer prior to the deposition of a second dielectric layer, the via openings are over-etched to compensate for subsequent deposition of the second dielectric layer.

13. The process defined by claim 12 wherein the first layer comprises a low k material.

14. The process defined by claim 13 wherein the low k material comprises carbon-doped oxide.

15. The process defined by claim 12 wherein the second layer comprises a low k material having poor step coverage.

16. The process defined by claim 15 wherein the low k material of the second layer comprises carbon-doped oxide.

17. The process defined by claim 12 wherein trenches are etched in the second dielectric layer overlying the via openings, and where the trenches are over-etched to remove any dielectric material deposited at the bottom of the via openings by the second dielectric deposition step.

18. A method for fabricating an interconnect layer comprising:

depositing a first dielectric layer over an underlying interconnect layer;

etching vias in the first dielectric layer, the vias are over-etched to compensate for subsequent deposition of a second dielectric layer;

depositing the second dielectric layer over an upper surface of the first dielectric layer, the second dielectric layer covering openings in the vias;

forming trenches in the second dielectric layer overlying the vias;

exposing conductors in the underlying interconnect layer; and forming a barrier layer and a copper layer in the trenches and vias.

19. The method defined by claim 18 wherein the first dielectric layer comprises a carbon-doped oxide.

20. The method defined by claim 19 wherein the second dielectric layer comprises a carbon-doped oxide.

21. The method defined by claim 18 wherein the second dielectric layer has poor gap filling qualities, and consequently, does not fill the underlying vias.

* * * * *